United States Patent [19]
Ono et al.

[11] Patent Number: 5,453,874
[45] Date of Patent: Sep. 26, 1995

[54] SEMICONDUCTOR OPTICAL COMPONENT AND MANUFACTURING METHOD THEREFOR

[75] Inventors: Takahiro Ono; Hisaharu Yanagawa, both of Tokyo, Japan

[73] Assignee: The Furukawa Electric Co., Ltd., Tokyo, Japan

[21] Appl. No.: 90,075

[22] PCT Filed: Nov. 20, 1992

[86] PCT No.: PCT/JP92/01526

§ 371 Date: Sep. 2, 1993

§ 102(e) Date: Sep. 2, 1993

[87] PCT Pub. No.: WO93/10478

PCT Pub. Date: May 27, 1993

[30] Foreign Application Priority Data

Nov. 22, 1991 [JP] Japan ..................... 3-307666

[51] Int. Cl.⁶ .................................................. G02B 6/12
[52] U.S. Cl. ..................... 359/344; 437/129; 437/249; 385/14
[58] Field of Search ................... 385/14; 359/341, 359/344; 372/50; 437/129, 249, 5

[56] References Cited

U.S. PATENT DOCUMENTS

| | | | |
|---|---|---|---|
| 4,809,290 | 2/1989 | White et al. | 372/50 |
| 5,332,690 | 7/1994 | Cho et al. | 385/14 |

FOREIGN PATENT DOCUMENTS

| | | |
|---|---|---|
| 0411145A1 | 2/1991 | European Pat. Off. . |
| 0434528A1 | 6/1991 | France . |
| 59-135441 | 8/1984 | Japan . |
| 62-262834 | 11/1987 | Japan . |
| 63-26637 | 2/1988 | Japan . |
| 2-199430 | 8/1990 | Japan . |

OTHER PUBLICATIONS

"Carrier–Injection Type Optical S3 Switch with Traveling–Wave Amplifier", H. Inoue et al., IEEE Photonics Technology Letters, vol. 2, No. 3, Mar. 1990, pp. 214–215.

*Primary Examiner*—William D. Larkins
*Attorney, Agent, or Firm*—Frishauf, Holtz, Goodman, Langer & Chick

[57] ABSTRACT

A manufacturing method for a semiconductor optical component in which ridge-shaped semiconductor light amplifier sections and ridge-shaped semiconductor waveguides connected thereto are integrated on the same substrate includes the steps of forming the ridge-shaped semiconductor light amplifier sections having a path width narrower than that of the ridge-shaped semiconductor waveguide at the appropriate positions on the substrate on which the ridge-shaped semiconductor light amplifier sections are to be formed; and forming the ridge-shaped semiconductor waveguide at the remaining positions other than the appropriate positions so as to connect to the ridge-shaped semiconductor light amplifier sections. The semiconductor optical component manufactured by this method provides high current density because the confining of the current injected to the light amplifier is strengthened. Therefore, it is useful as an optical component which can perform light amplification efficiently even if a small current is injected.

7 Claims, 7 Drawing Sheets

SEMICONDUCTOR OPTICAL COMPONENT AND MANUFACTURING METHOD THEREFOR

TECHNICAL FIELD

The present invention relates to a semiconductor optical component, in which ridge-shaped semiconductor light amplifier sections and ridge-shaped semiconductor waveguides are integrated on the same substrate in a connected state, and a manufacturing method therefor and, more particularly, a semiconductor optical component, in which electric current of a high current density can be injected to the semiconductor light amplifier section because the current confining effect is large when the semiconductor light amplifier section is operated, and therefore light amplification can be effected efficiently even if a small current is injected, and a manufacturing method therefor.

BACKGROUND ART

A manufacturing method for a semiconductor light switch having a semiconductor light amplifier section and a semiconductor waveguide integrated on the same substrate has been disclosed in IEEE Photonics Technology Letters, vol. 2, pp. 214–215, March 1990.

With this method, thin layers of a predetermined semiconductor are successively laminated on the entire surface of a semiconductor substrate so as to correspond to the layer structure of a light amplifier section to be formed in order to form a lower cladding layer, a core layer, and an upper cladding layer. Then, the laminated body of the semiconductor thin layers in the area other than the area in which a light amplifier section is to be formed is etched and removed to expose the surface of the substrate, and thereafter thin layers of a predetermined semiconductor are successively laminated on the exposed surface of the substrate so as to correspond to the layer structure of a waveguide to be formed in order to form a lower cladding layer, a core layer, and an upper layer.

Subsequently, a switching section is formed by diffusing, for example, Zn in a predetermined area of the waveguide, the entire construction is etched to form a ridge-shaped waveguide having the same width, a desired pattern, and a desired height in the upper cladding layers of the laminated bodies corresponding to the light amplifier section and the waveguide, respective electrodes are mounted on the switching section and the light amplifier section, and a common electrode is mounted on the back surface of the substrate.

In this semiconductor light switch, the waveguide and the light amplifier section formed in a ridge shape have an equal path width. Switching operation is performed by injecting electric current to the switching section of the waveguide, whereas light amplification is performed by injecting electric current to the light amplifier section.

Japanese Patent Laid-Open No. 2-199430 discloses a semiconductor light switch which has waveguides of an equal width crossing in an X form, a bypass waveguide formed between the input port and the output port of respective waveguides and having a width equal to that of the aforesaid waveguide, and a light amplifier section formed on the bypass waveguide. The sectional construction of the waveguide, light amplifier section, and switching section of this semiconductor light switch is similar to that disclosed in IEEE Photonics Technology Letters.

In any of the light switches of two kinds described above, the confinement of light transmitted to the core layer at the waveguide and light amplifier section is effected by the equal-width ridges formed in the respective upper cladding layers.

For the light switches of this construction, the path width of the core layer through which light is substantially transmitted is equal for the waveguide and the light amplifier section. For this reason, the effect of confining the injected current is small when electric current is injected to the light amplifier section; therefore, it is difficult to increase the current density of the injected current. As a result, it is difficult to achieve highly efficient light amplification.

DISCLOSURE OF THE INVENTION

An object of the present invention is to solve the above problem with the light switch in which waveguides and light amplifier sections are integrated on the same substrate, and to provide a semiconductor optical component in which the confining state of the current injected to the light amplifier section is strengthened, thereby light amplification being performed with high efficiency, and a manufacturing method therefor.

The present invention provides a semiconductor optical component comprising a ridge-shaped semiconductor light amplifier section and a ridge-shaped semiconductor waveguide connected thereto, which are formed on the same substrate, wherein the path width of the ridge-shaped semiconductor light amplifier section is narrower than that of the ridge-shaped semiconductor waveguide. Preferably, a semiconductor optical component is provided in which the ridge height of the ridge-shaped semiconductor light amplifier section is greater than that of the ridge-shaped semiconductor waveguide.

Further, the present invention provides a manufacturing method for a semiconductor optical component in which ridge-shaped semiconductor light amplifier sections and ridge-shaped semiconductor waveguides connected thereto are integrated on the same substrate, comprising the steps of forming the ridge-shaped semiconductor light amplifier sections having a path width narrower than that of the ridge-shaped semiconductor waveguides at the appropriate positions on the substrate on which the ridge-shaped semiconductor light amplifier sections are to be formed; and forming the ridge-shaped semiconductor waveguide at the remaining positions other than the appropriate positions so as to connect to the ridge-shaped semiconductor light amplifier sections.

Preferably, there is provided a manufacturing method for a semiconductor optical component in which the ridge-shaped semiconductor light amplifier section is formed in such a manner that the ridge height thereof is greater than that of the ridge-shaped semiconductor waveguide.

In the semiconductor optical component manufactured by the method of the present invention, since the path width of the light amplifier section is narrower than that of the waveguide, the confining of the injected current is increased at the light amplifier section, thereby the current density being increased. As a result, light can be amplified at high efficiency.

Also, the coupling efficiency of light can be increased because the ridge height of the light amplifier section is greater than that of the waveguide.

BEST MODE FOR CARRYING OUT THE INVENTION

Figure 1:
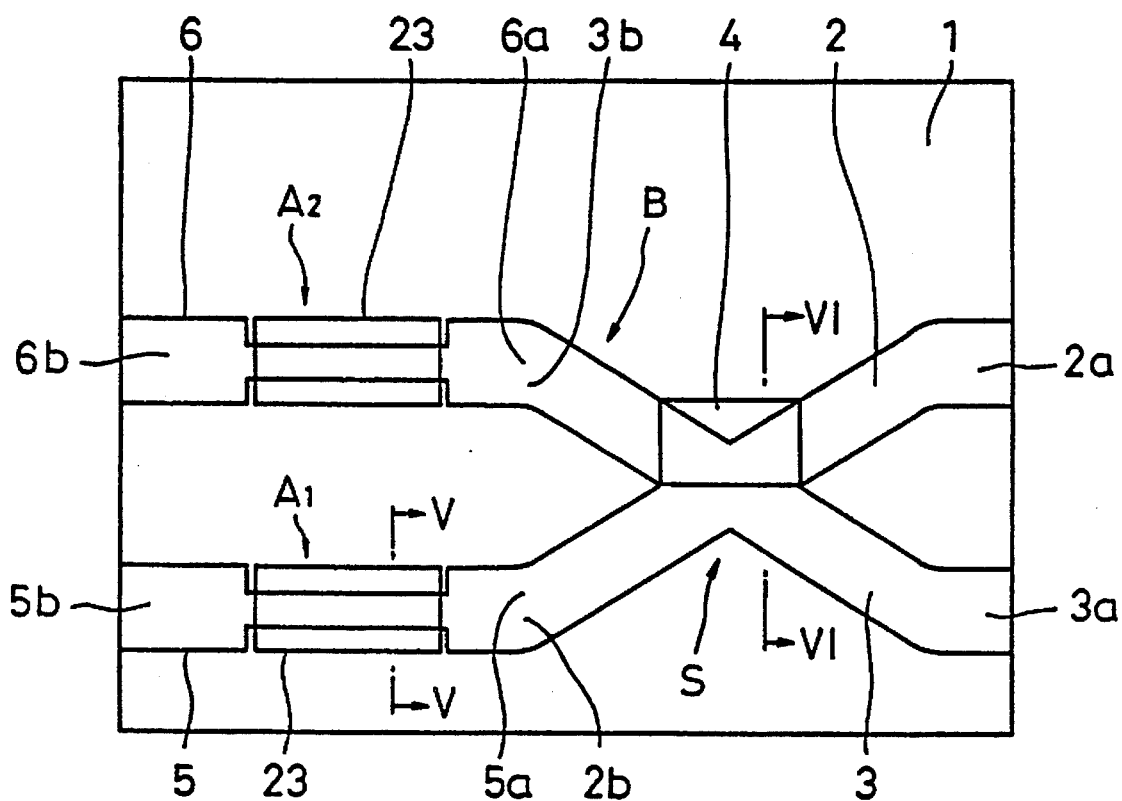
FIG. 1 is a schematic plan view of a total reflection type light switch manufactured by the method of the present invention.

FIG. 1 shows an example of total reflection type light switch manufactured by the method of the present invention. In the figure, two waveguides 2 and 3 crossing each other are formed on a semiconductor substrate 1 by laminating thin layers of a predetermined semiconductor. At the cross section, an electrode 4 for injecting electric current is mounted to form a switching section S.

A waveguide 5 formed by laminating thin layers of a predetermined semiconductor is connected to a port 2b of the waveguide 2 at a port 5a, whereas a waveguide 6 formed by laminating thin layers of a predetermined semiconductor is connected to a port 3b of the waveguide 3 at a port 6a.

At the intermediate portion of the waveguide 5 extending from the port 5a to a port 5b, a light amplifier section $A_1$ is formed which has a path width smaller than that of the waveguide 5 and is provided with an electrode 23. Likewise, at the intermediate portion of the waveguide 6 extending from the port 6a to a port 6b, a light amplifier section $A_2$ is formed which has a path width smaller than that of the waveguide 6 and is provided with an electrode 23.

This light switch is manufactured by the method described below. This method will be described with reference to the drawings.

Figure 2:
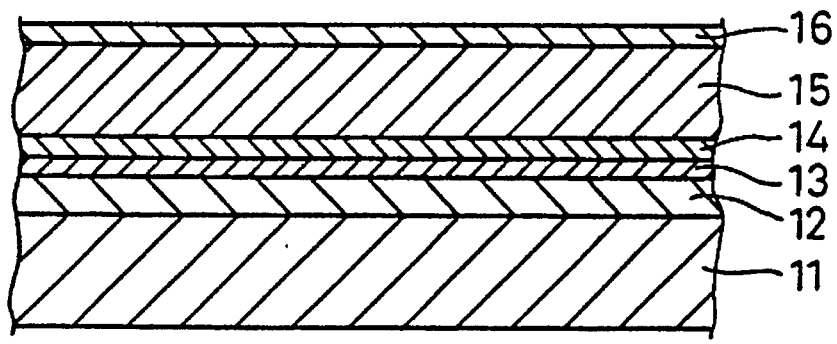
FIG. 2 is a partial sectional view showing the waveguide layer, active layer, waveguide layer, cladding layer, and surface layer laminated on a substrate.

As shown in FIG. 2, for example, a waveguide layer 12 formed of n-type InGaAsP semiconductor, an active layer 13 formed of undoped InGaAsP semiconductor, and a waveguide layer 14 formed of p-doped InGaAsP semiconductor are successively laminated on the surface of a substrate 11 formed of, e.g., n-type InP semiconductor by using a film forming technique such as the MOCVD method. Further, for example, an upper cladding layer 15 formed of p-doped InP semiconductor and a surface layer 16 formed of p-doped InGaAs semiconductor are successively laminated on the waveguide layer 14. Here, the waveguide layer 12 constitutes a lower cladding layer, and the active layer 13 and the waveguide layer 14 constitute a core layer.

Figure 3:
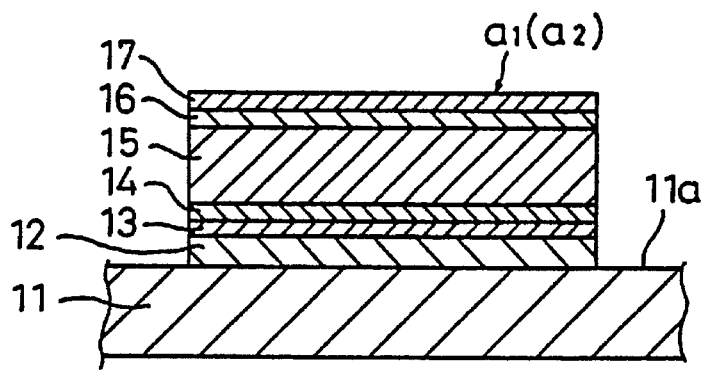
FIG. 3 is a partial sectional view showing a condition in which a laminated body $a_1$ ($a_2$) of a section to be operated as a light amplifier section is formed.

Of the slab-shaped laminated body thus formed on the substrate 11, on the surface layer 16 in the area $a_1$ ($a_2$) functioning as a light amplifier section, an insulating film 17 such as $SiO_2$ film is formed. This film is used as a mask, and the portion of the laminated body excluding the area $a_1$ ($a_2$) is etched and removed so as to expose the surface 11a of the substrate 11 as shown in FIG. 3.

Figure 4:
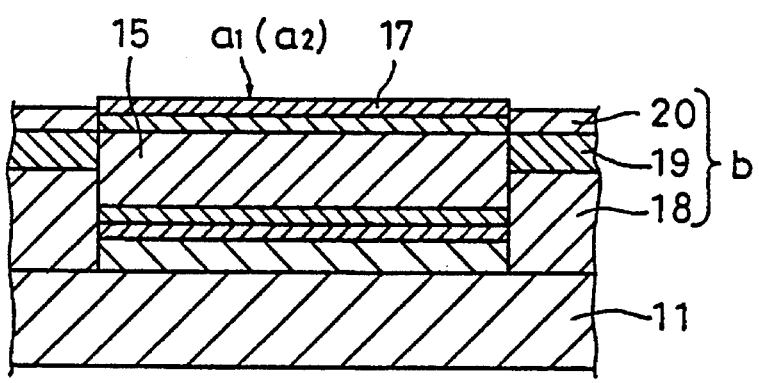
FIG. 4 is a partial sectional view showing a condition in which a waveguide layer, upper cladding layer, and surface layer of a waveguide are formed on the substrate surface.

Then, a waveguide layer 18 formed of, e.g. undoped InGaAsP semiconductor is formed on the exposed surface 11a of the substrate only, as shown in FIG. 4, for example, by the MOCVD method so that its thickness reaches the middle of the upper cladding layer 15. Further, a cladding layer 19 formed of, e.g. undoped InP semiconductor and a surface layer 20 formed of, e.g. undoped InGaAs semiconductor are successively formed over the waveguide layer 18 only.

Thus, a waveguide section is formed by a laminated body b consisting of the waveguide layer 18, the cladding layer 19, and the surface layer 20, so that the laminated body $a_1$ ($a_2$) formed to constitute a light amplifier section $A_1$ ($A_2$) is surrounded by the laminated body b formed to constitute a waveguide.

Then, the insulating film 17 on the laminated body $a_1$ ($a_2$) is removed, and an elevated stepped or ridge-shaped waveguide of a planar pattern including the switching section S and the light amplifier section $A_1$ ($A_2$) as shown in FIG. 1 is formed. Thereafter, the entire surface of the laminated bodies $a_1$ ($a_2$) and b are covered again with an insulating film 21 such as $SiO_2$.

Figure 5:
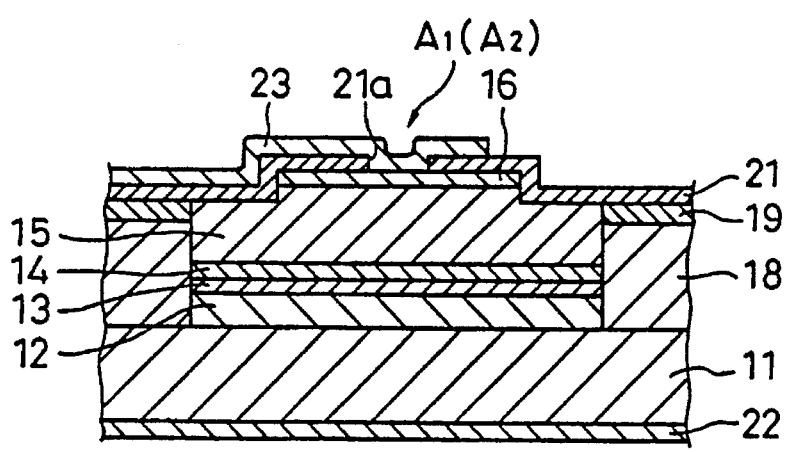
FIG. 5 is a sectional view taken along the line V—V of FIG. 1.

Next, as shown in FIG. 5, which is a sectional view taken along the line V—V of FIG. 1, a lower common electrode 22 is mounted by depositing a material such as AuGeNi/Au on the back surface of the substrate 11. Further, a part of the insulating film 21 on the laminated body corresponding to the light amplifier section $a_1$ ($a_2$) is removed to form a window 21a. From here, a material such as Ti/Pt/Au is deposited on the surface layer 16 to mount an upper electrode 23, 23 for the light amplification, thereby the light amplifier section $A_1$ ($A_2$) being formed.

Figure 6:
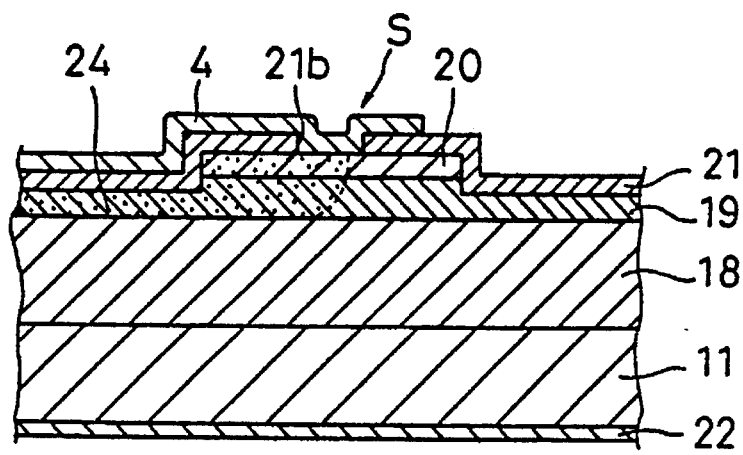
FIG. 6 is a sectional view taken along the line VI—VI of FIG. 1.

As shown in FIG. 6, which is a sectional view taken along the line VI—VI of FIG. 1, in the switching section S, a part of the insulating film 21 covering the switching section S is removed to form a window 21b. Zn diffusion zone 24 is formed by diffusing, e.g., Zn from this window. Then, a material such as Ti/Pt/Au is deposited on the surface layer 20 to mount an upper electrode 4 for a switching operation, thereby the switching section S being formed.

For this light switch, for example, if light is introduced through the port 3a without current injection from the electrodes 4, 23, and 23 in FIG. 1, the incident light passes through the waveguide 3, the port 3b, the port 6a, the light amplifier section $A_2$, and the waveguide 6, and then goes out through the port 6b. Hereinafter, this state is called the switch state I.

If light is introduced through the port 3a with current being injected through the electrode 4 but other electrodes 23, 23 being not in operation, the incident light passes through the waveguide 3, the switching section S, the waveguide 2, the port 2b, the light amplifier section $A_1$, and the waveguide 5 by the action of the switching section S, and then goes out through the port 5b. Hereinafter, this state is called the switch state II.

In the switch state I, if current is injected through the electrode at the light amplifier section $A_2$ with the electrode at the light amplifier section $A_1$ being not in operation, the light transmitted from the port 3a to the waveguide 6 is amplified at the light amplifier section $A_2$.

In the switch state II, if current is injected through the electrode at the light amplifier section $A_1$ with the electrode at the light amplifier section $A_2$ being not in operation, the light transmitted from the port 3a to the waveguide 5 by changing the optical path at the switching section S is amplified at the light amplifier section $A_1$.

In either operation, since the path width at the light amplifier section $A_1$ ($A_2$) is narrower than the path width of the waveguide 5 (6), the confining of the injected current is not weakened as compared with the case of equal width, thereby highly efficient light amplification being achieved.

Next, a manufacturing method for a semiconductor optical component will be described by using a total reflection type switch as an example. In the total reflection type switch, the height of the ridge or elevated step at the light amplifier section is greater than that at the waveguide; therefore, the coupling efficiency of light to the active layer can be further increased.

First, as shown in FIGS. 2 and 3, a waveguide layer 12 formed of n-type InGaAsP semiconductor, an active layer 13 formed of undoped InGaAsP semiconductor, a waveguide layer 14 formed of p-doped InGaAsP semiconductor, an upper cladding layer 15 formed of p-doped InP semiconductor, and a surface layer 16 formed of p-doped InGaAs semiconductor are successively laminated on a substrate 11. Thereafter, on the portion of the laminated body thus formed on the substrate 11, including a part of the laminated body functioning as a light amplifier section, an insulating film 17 such as $SiO_2$ film is formed. This film is used as a mask, and the entirety of the laminated body excluding the above-mentioned part is etched and removed so as to expose the surface 11a of the substrate 11.

Figure 7:
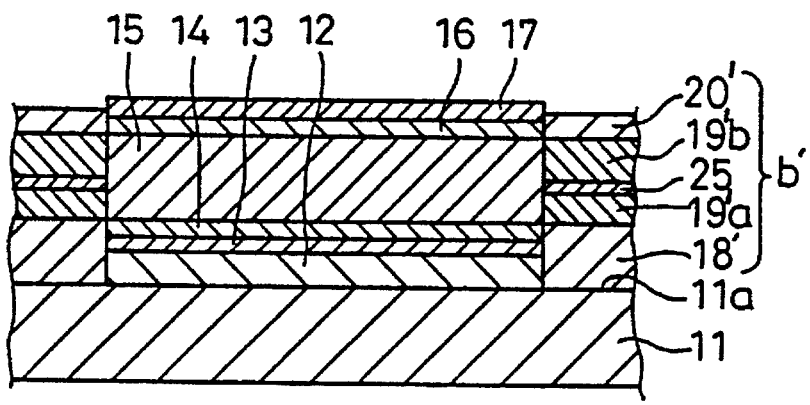
FIG. 7 is a partial sectional view showing a condition in which a waveguide layer, first upper cladding layer, etch stop layer, second upper cladding layer, and surface layer of a waveguide are formed surrounding a light amplifier section when an optical component having a light amplifier section of a high ridge shape is manufactured.

Then, as shown in FIG. 7, a waveguide layer 18' formed of, e.g. undoped InGaAsP semiconductor is formed only on the exposed surface 11a of the substrate so that its thickness reaches the height of the waveguide layer 14. Further, a first upper cladding layer 19'a formed of undoped InP semiconductor, an etch stop layer 25 formed of undoped InGaAsP semiconductor, a second upper cladding layer 19'b formed of undoped InP semiconductor, and a surface layer 20' formed of undoped InGaAs semiconductor are successively laminated to form a laminated body b' for constituting a waveguide.

Next, the insulating film at the portion including the area where the light amplifier section is formed is temporarily removed to expose the surface layer 16. Thereafter, as shown by a planar pattern in FIG. 1, a pattern of insulating film 17' such as $SiO_2$ is formed by covering the area where the light amplifier section $A_1$ ($A_2$) is to be formed and the area where the switching section S and the waveguide 2, 3, 5, and 6 are to be formed. By using this film as a mask, the entire surface layers 20' and 16 exposed to the surface are removed by using, for example, an etchant including sulfuric acid. In this process, the pattern of the insulating film 17' is drawn in such a manner that the pattern path width of the area where the light amplifier section $A_1$ ($A_2$) is to be formed is smaller than that where the waveguide 2, 3, 5 and 6 is to be formed.

Figure 8:
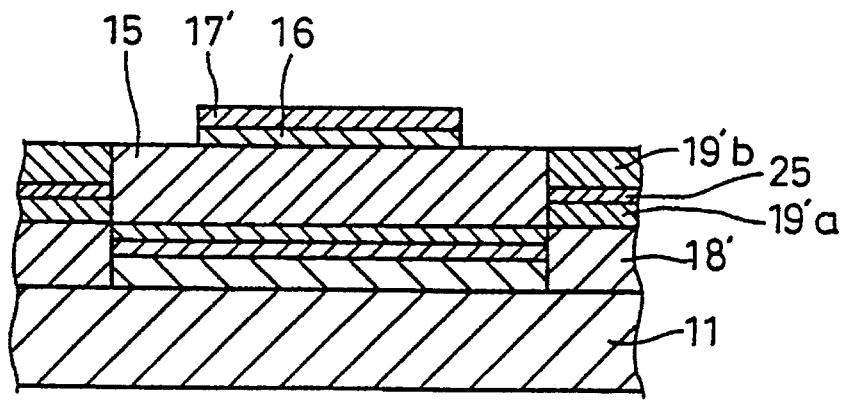
FIG. 8 is a partial sectional view showing a condition in which the light amplifier section in the construction shown in FIG. 7 is etched with an etchant including sulfuric acid.
Figure 9:
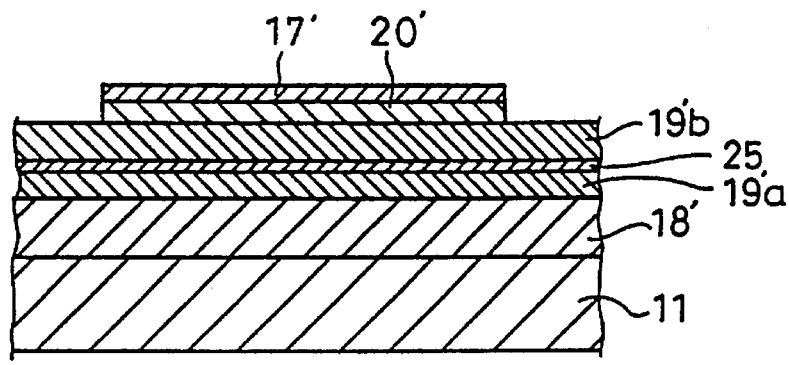
FIG. 9 is a partial sectional view showing a condition in which the waveguide in the construction shown in FIG. 7 is etched with an etchant including sulfuric acid.

As the result of etching process, the area where the light amplifier section $A_1$ ($A_2$) is to be formed has a sectional construction as shown in FIG. 8, whereas the area where the switching section S and the waveguide 2, 3, 5, and 6 are to be formed has a sectional construction as shown in FIG. 9.

Figure 10:
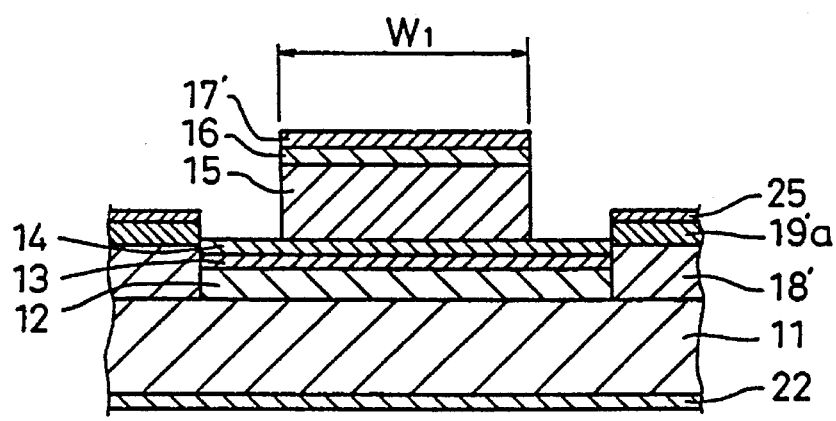
FIG. 10 is a partial sectional view showing a condition in which the construction shown in FIG. 8 is etched with an etchant including hydrochloric acid.
Figure 11:
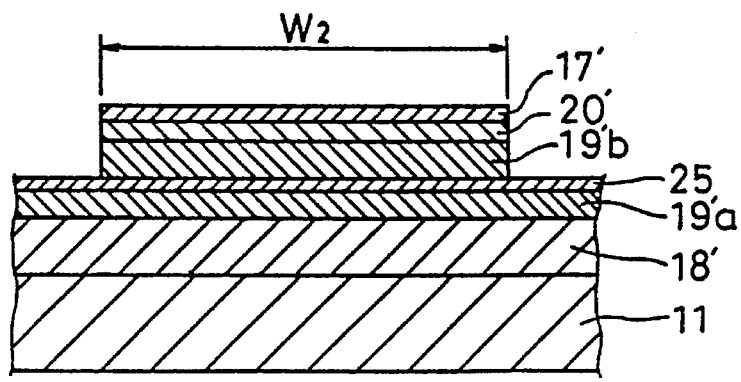
FIG. 11 is a partial sectional view showing a condition in which the construction shown in FIG. 9 is etched with an etchant including hydrochloric acid.

Then, by performing etching using, e.g., an etchant including hydrochloric acid in place of a sulfuric acid etchant, the portion of upper cladding layer 15 exposed in the area where the light amplifier section $A_1$ ($A_2$) is to be formed is removed as shown in FIG. 10. At the same time, as shown in FIG. 11, the second upper cladding layer 19'b exposed in the area where the waveguide and the switching section to be formed is removed to form a light amplifier section having a path width $W_1$ and a waveguide having a path width $W_2$ ($W_2 > W_1$). In this process, etching does not proceed beyond the etch stop layer 25 at the waveguide and the switching section S by the action of etch stop layer 25.

Figure 12:
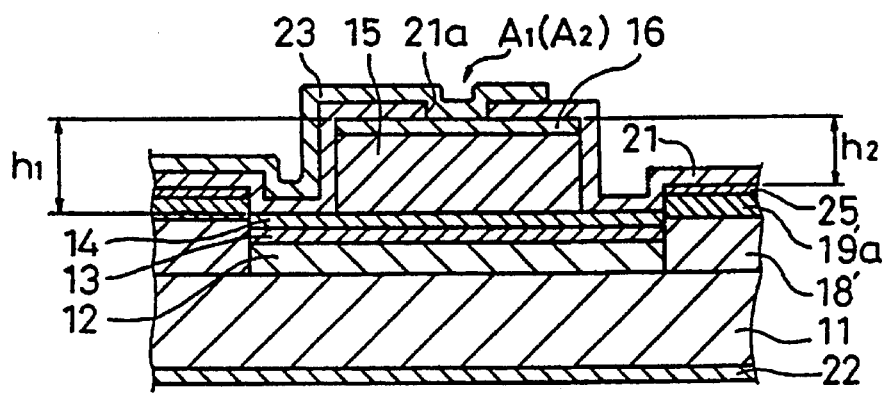
FIG. 12 is a partial sectional view showing the sectional construction of the light amplifier section.
Figure 13:
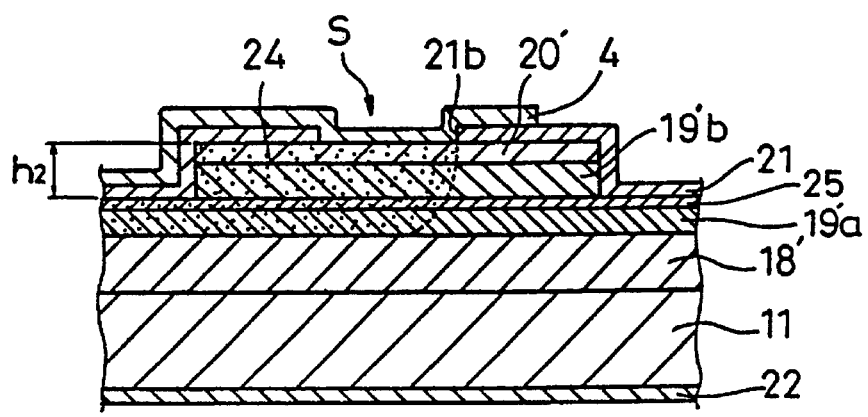
FIG. 13 is a partial sectional view showing the sectional construction of the switching section.

After the insulating film 17' of the planar pattern shown in FIG. 1 is removed temporarily, the entire surface is covered again to form an insulating film 21 such as $SiO_2$ film. On the back surface of the substrate 11, a lower common electrode 22 is mounted in the same way as shown in FIG. 5. In the area where the light amplifier section $A_1$ ($A_2$) is to be formed, a window 21a is formed in the insulating film 21, and an upper electrode 23 for light amplification is mounted as shown in FIG. 12. At the switching section S, a window 21b is formed in the insulating film 21, from which, e.g., Zn is diffused to form a Zn diffusion area 24 as shown in FIG. 13. Thereafter, an upper electrode 4 for a switching operation is mounted.

Thus, the light amplifier section $A_1$ ($A_2$), the waveguides 2, 3, 5, and 6, and the switching section S are formed, either of which is of a ridge shape. The path width $W_1$ of the light amplifier section $A_1$ ($A_2$) is narrower than the path width $W_2$ of the waveguide 2, 3, 5, and 6 connecting to the light amplifier section $A_1$ ($A_2$). Although the path height of all of the light amplifier section $A_1$ ($A_2$), the surfaces of the waveguides 2, 3, 5, and 6, and the switching section S constitute the same plane, at the light amplifier section $A_1$ ($A_2$), the base is dug from the surface of the surrounding etch stop layer 25 to the waveguide layer 14. Therefore, the ridge height ($h_1$) of the light amplifier section $A_1$ ($A_2$) from the waveguide layer 14 to the surface of the surface layer 16 is greater than the ridge height ($h_2$) of the waveguide 2, 3, 5, and 6 from the etch stop layer 25 to the surface of the surface layer 20' of the waveguide 2, 3, 5, and 6.

Figure 14:
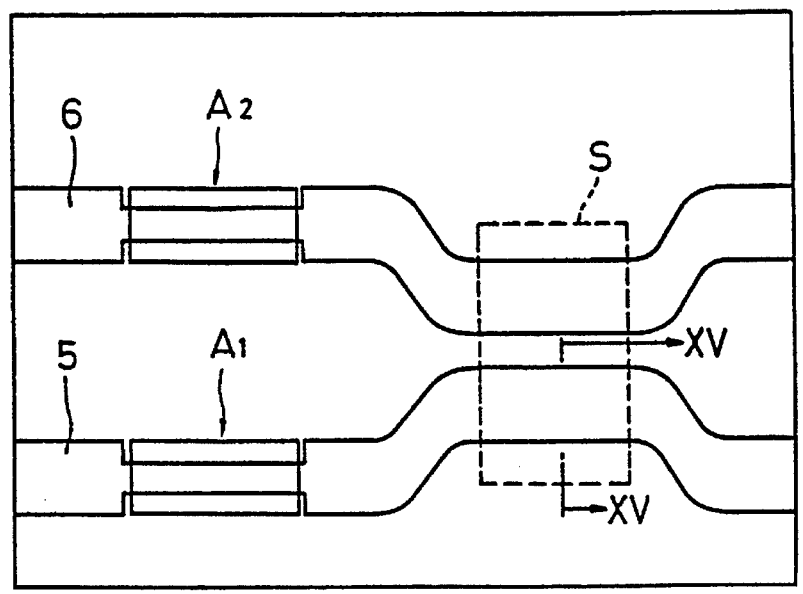
FIG. 14 is a schematic plan view of a directional coupler type light switch manufactured by the method of the present invention.

FIG. 14 is a schematic plan view of a directional coupler type light switch manufactured by the method of the present invention. The sectional construction of the light amplifier section $A_1$ ($A_2$) of this light switch is the same as that of the total reflection type light switch shown in FIG. 12.

Figure 15:
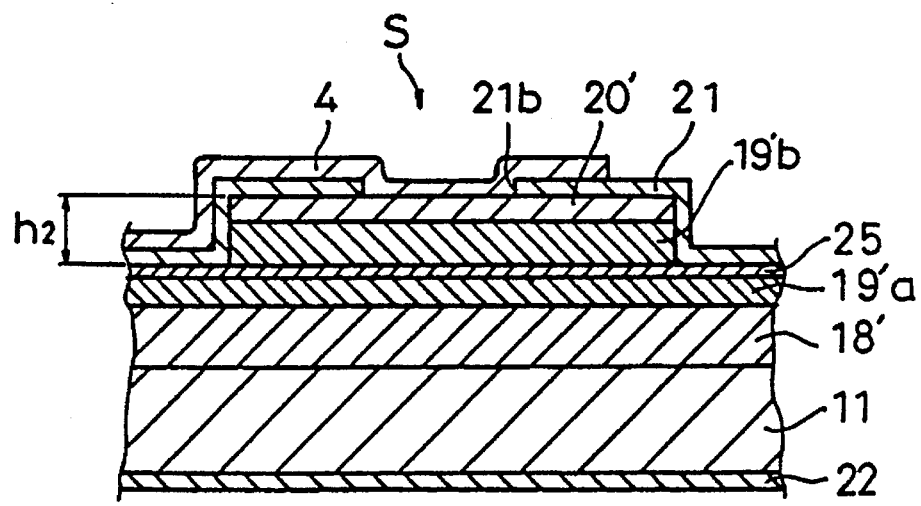
FIG. 15 is a sectional view taken along the line XV—XV of FIG. 14.

The sectional construction of the coupling section (switching section) has a first upper cladding layer 19'a, an etch stop layer 25, a second upper cladding layer 19'b, and a surface layer 20' formed of p-doped InP semiconductor, p-doped InGaAsP semiconductor, p-doped InP semiconductor, and p-doped InGaAs semiconductor, respectively, as shown in FIG. 15, which is a sectional view taken along the line XV—XV of FIG. 14, being the same as that shown in FIG. 13 except that Zn diffusion area 24 is not formed.

The waveguide except the coupling section S has the same sectional construction as the above-mentioned coupling section S except that an upper electrode is not mounted and the entire surface is covered with the insulating film 21.

Figure 16:
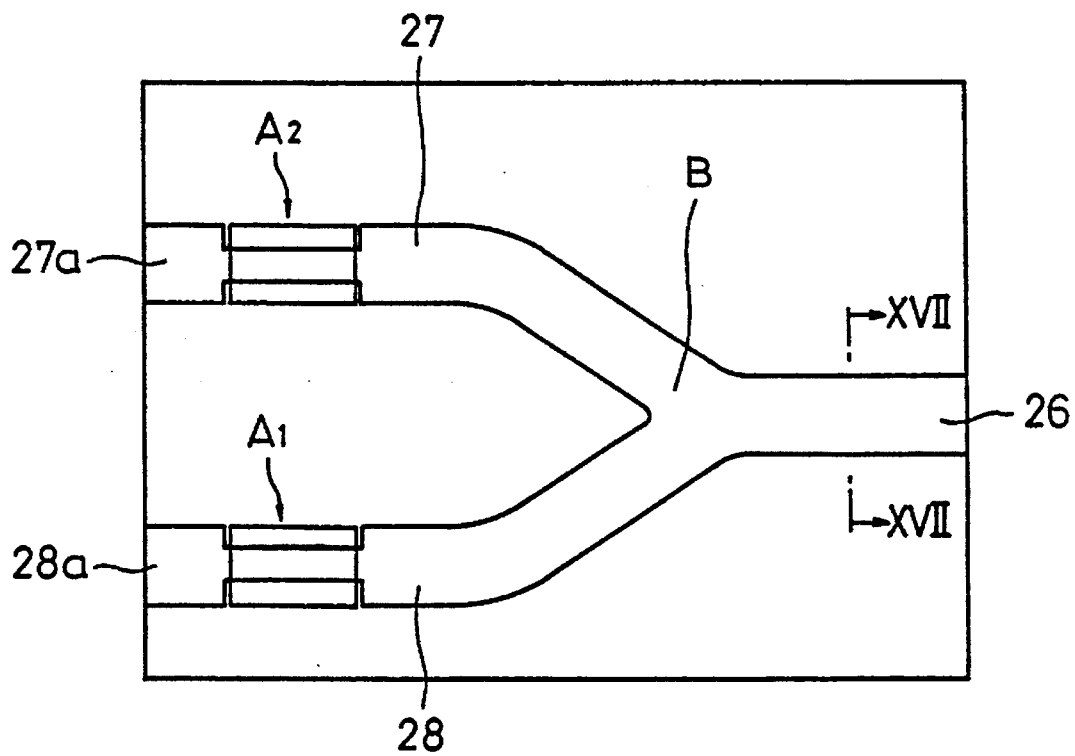
FIG. 16 is a schematic plan view of a 1×2 optical coupler manufactured by the method of the present invention.
Figure 17:
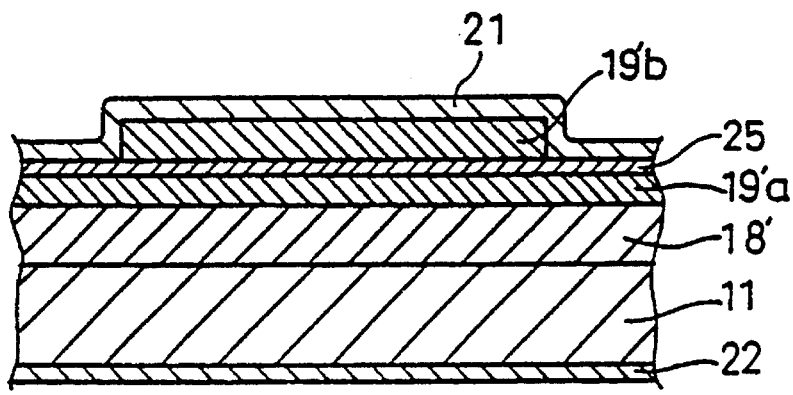
FIG. 17 is a sectional view taken along the line XVII—XVII of FIG. 16.

FIG. 16 is a schematic plan view showing an example of semiconductor optical component in which a 1×2 optical coupler and a light amplifier section are integrated. The light amplifier section $A_1$ ($A_2$) of this optical component has a sectional construction as shown in FIG. 12. The sectional construction of the waveguide is such that the entire surface of the second cladding layer 19'b and the etch stop layer 25 is only covered with an insulating film 21 as shown in FIG. 17, which is a sectional view taken along the line XVII—XVII of FIG. 16.

For this optical component, light which is introduced through a port 26 is divided into two components at the branch section, and each of light is transmitted through respective branching waveguides 27 and 28. With this optical component, the degree of amplification at the light amplifier section $A_1$ ($A_2$) can be changed by changing the value of current injected through the light amplifier section $A_1$ ($A_2$). Therefore, the output of light going out of the respective ports 27a and 28a of the branching waveguide 27 and the branching waveguide 28 can be changed, by which any branching ratio can be obtained.

EXAMPLES

Example 1

A total reflection type light switch shown in FIGS. 1 through 6 was manufactured as described below.

First, a 0.20 μm-thick waveguide layer (absorption edge wavelength: $\lambda_g$=1.15 μm) 12 formed of n-type InGaAsP, a 0.20 μm-thick active layer ($\lambda_g$=1.30 μm) 13 formed of undoped InGaAsP, a 0.20 μm-thick waveguide layer ($\lambda_g$=1.15 μm) 14 formed of p-doped InGaAsP, a 1.40 μm-thick cladding layer 15 formed of p-doped InP, and a 0.20 μm-thick surface layer 16 formed of p-doped InGaAsP were successively laminated on the entire surface of a substrate 11 formed of n-type InP by the MOCVD method to produce a laminated body with a total thickness of 2.20 μm (FIG. 2).

Then, a $SiO_2$ film 17 was formed on the surface layer 16. With this film being used as a mask, the entire portion of the laminated body excluding the area $a_1$ ($a_2$) of 500 μm in length and 100 μm in width was etched and removed to expose the surface 11a of the substrate 11 (FIG. 3).

Again with the $SiO_2$ film 17 being used as a mask, a 1.00 μm-thick waveguide layer ($\lambda_g$=1.02 μm) 18 formed of undoped InGaAsP, a 0.90 μm-thick cladding layer 19 formed of undoped InP, and a 0.20 μm-thick surface layer 20 formed of undoped InGaAs were successively laminated on the exposed surface 11a of the substrate 11 with the MOCVD method to produce a laminated body b with a total thickness of 2.10 μm (FIG. 4).

Then, the $SiO_2$ film was removed, and elevated steps or ridges were formed by applying photolithography to the entire surface; the ridge had a path width of 2.0 μm at the light amplifier section $A_1$ ($A_2$) and 8.0 μm at the waveguides 2, 3, 5, and 6. Thereafter, the entire surface was covered with a $SiO_2$ film again (FIG. 1).

Finally, AuGeNi/Au was deposited on the back surface of the substrate to mount a common lower electrode 22. The $SiO_2$ film 21 on the light amplifier section $A_1$ ($A_2$) and the switching section S was removed. For the switching section S, a Zn diffusion zone 24 was formed by diffusing Zn from the portion where the $SiO_2$ film was removed. In this zone, Ti/Pt/Au was deposited to mount upper electrodes 23, 23, and 4 (FIGS. 5 and 6).

For this light switch, when the value of current injected to the light amplifier $A_2$ was 200 mA, the insertion loss was 0 dB, and the extinction ratio was 27 dB in the switch state I. When the value of current injected to the light amplifier $A_1$ was 230 mA in the switch state II, the insertion loss was 0 dB and the extinction ratio was 36 dB.

Example 2

A total reflection type light switch having a light amplifier section and a switching section of sectional construction as shown in FIGS. 12 and 13 and a planar pattern as shown in FIG. 1 was manufactured as described below.

First, as shown in FIG. 2, a 0.23 μm-thick waveguide layer ($\lambda_g$=1.05 μm) 12 formed of n-type InGaAsP, a 0.14 μm-thick active layer ($\lambda_g$=1.30 μm) 13 formed of undoped InGaAsP, a 0.23 μm-thick waveguide layer ($\lambda_g$=1.05 μm) 14 formed of p-doped InGaAsP, a 2.00 μm-thick cladding layer 15 formed of p-doped InP, and a 0.20 μm-thick surface layer 16 formed of p-doped InGaAs were successively laminated on the entire surface of a substrate 11 formed of n-type InP by the MOCVD method to produce a laminated body with a total thickness of 2.80 μm.

Then, a $SiO_2$ film 17 was formed on the surface layer 16. With this film being used as a mask, the entire portion of the laminated body excluding the area $a_1$ ($a_2$) of 500 μm in length and 50 μm in width was etched and removed to expose the surface 11a of the surface 11 (FIG. 3).

Again with the $SiO_2$ film 17 being used as a mask, a 0.60 μm-thick waveguide layer ($\lambda_g$=1.15 μm) 18' formed of undoped InGaAsP, a 0.50 μm-thick first upper cladding layer 19'a formed of undoped InP, a 0.01 μm-thick etch stop layer 25 formed of undoped InGaAsP, a 1.50 μm-thick second upper cladding layer 19'b formed of undoped InP, and a 0.20 μm-thick surface layer 20' formed of undoped InGaAs were successively laminated on the exposed surface 11a of the substrate 11 with the MOCVD method as shown in FIG. 7 to produce a laminated body b' with a total thickness of 2.81 μm (FIG. 7).

Then, the $SiO_2$ film 17 was removed, and a pattern of $SiO_2$ film 17' was formed on the surface layer 16 and the surface layer 20' as shown in FIG. 1 such that the path width of the light amplifier section $A_1$ ($A_2$) was 2.0 μm, and that of the waveguide 2, 3, 5, and 6 was 8.0 μm. Thereafter, the entire surface was etched with an etchant including sulfuric acid to remove the exposed surface layer. Thus, in the light amplifier section $A_1$ ($A_2$), a sectional construction as shown in FIG. 8 was formed, whereas in the waveguides 2, 3, 5, and 6 and the switching section S, a sectional construction as shown in FIG. 9 was formed (FIGS. 8 and 9).

Then, etching was performed using an etchant including hydrochloric acid in place of an etchant including sulfuric acid so that a part of the upper cladding layer 15 was removed at the light amplifier section $A_1$ ($A_2$) and the second upper cladding layer 19'b was removed at the waveguides 2, 3, 5, and 6 and the switching section S. As a result, a planar pattern was formed such that respective sectional constructions were as shown in FIGS. 10 and 11.

Thus, the light amplifier section $A_1$ ($A_2$) with a path width of 2.0 μm and the waveguides 2, 3, 5, and 6 with a path width of 8.0 μm were formed. The ridge height ($h_1$) of the light amplifier section $A_1$ ($A_2$) was 2.20 μm, whereas the ridge height ($h_2$) of the waveguide 2, 3, 5, and 6 was 1.70 μm; the ridge height of the light amplifier section being greater than that of the waveguide.

Then, after all the $SiO_2$ film 17' was removed temporarily, a $SiO_2$ film 21 was formed to cover the entire surface. Thereafter, AuGeNi/Au was deposited on the back surface of the substrate to mount a common lower electrode 22. The insulating film 21 on the light amplifier section $A_1$ ($A_2$) and the switching section S was removed. For the switching section S, a Zn diffusion zone 24 was formed by diffusing Zn from the portion where the insulating film was removed. In this zone, Ti/Pt/Au was deposited to mount upper electrodes 23, 23, and 4, respectively. Thus, the light amplifier section $A_1$ ($A_2$) and the switching section S were formed as shown in FIGS. 12 and 13.

For this light switch, when the value of current injected to the light amplifier $A_2$ was 180 mA in the switch state I, the insertion loss was 0 dB, and the extinction ratio was 28 dB. When the value of current injected to the light amplifier $A_1$ was 200 mA in the switch state II, the insertion loss was 0 dB and the extinction ratio was 36 dB.

Figure 18:
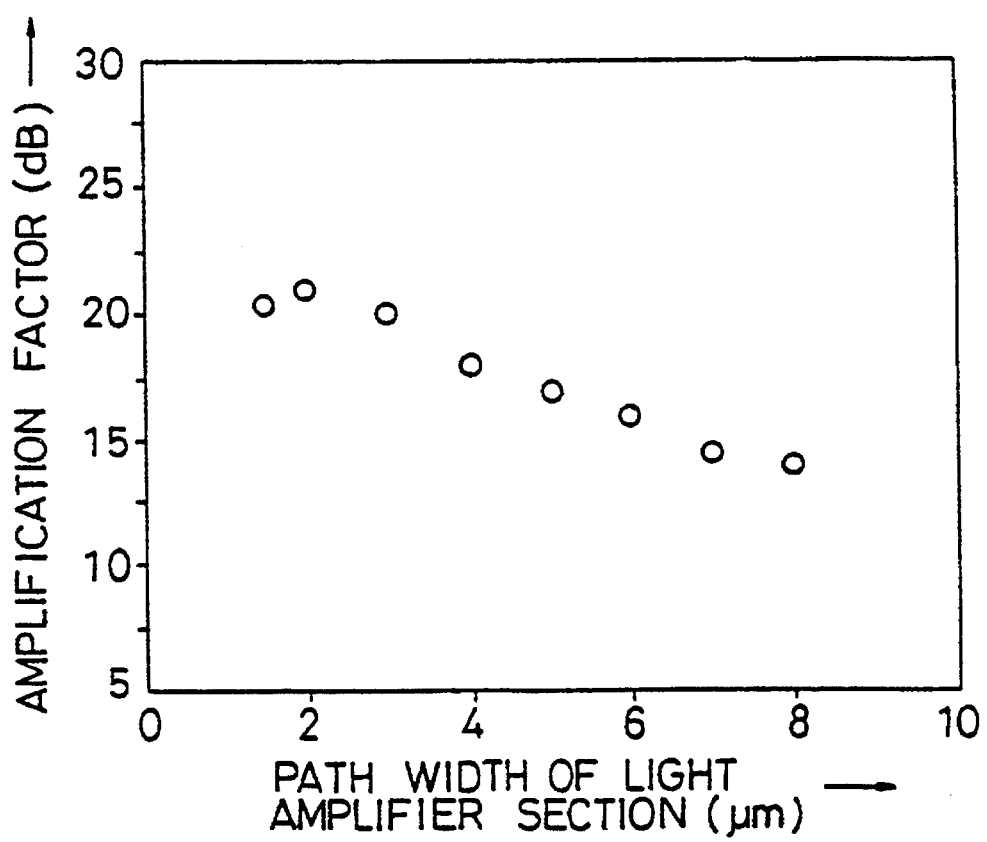
FIG. 18 is a graph showing the relationship between path width and amplification factor.

Further, a light switch with the same sectional construction and a different path width was manufactured by keeping the path width of the waveguide 8.0 μm and only changing the path width pattern of the light amplifier section $A_1$ ($A_2$) when a mask pattern was formed by the $SiO_2$ film 17. With the injected current to one of the light amplifier section $A_1$ ($A_2$) being set at 250 mA, the amplification factor was measured. The result is shown in FIG. 18 as a relationship between the path width of the light amplifier section $A_1$ ($A_2$) and the amplification factor. As seen from FIG. 18, the amplification factor is at a maximum when the path width is 2.0 μm. In addition, it is difficult to form the light amplifier section because its path width is too narrow. Therefore, the path width of the light amplifier section is preferably about 2.0 μm.

Example 3

A directional coupler type light switch as shown in FIG. 14 was manufactured as described below.

As shown in FIG. 2, a 0.23 μm-thick waveguide layer ($\lambda_g$=1.05 μm) 12 formed of n-type InGaAsP, a 0.14 μm-thick active layer ($\lambda_g$=1.30 μm) 13 formed of undoped InGaAsP, a 0.23 μm-thick waveguide layer ($\lambda_g$=1.05 μm) 14 formed of p-doped InGaAsP, a 2.00 μm-thick cladding layer 15 formed of p-doped InP, and a 0.20 μm-thick surface layer 16 formed of p-doped InGaAs were successively laminated on the entire surface of a substrate 11 formed of n-type InP by the MOCVD method to produce a laminated body with a total thickness of 2.80 μm.

Then, a $SiO_2$ film 17 was formed on the surface layer 16. With this film being used as a mask, the entire portion of the laminated body excluding the area $a_1$ ($a_2$) of 500 μm in length and 50 μm in width was etched and removed to expose the surface 11a of the surface 11 (FIG. 3).

Again with the $SiO_2$ film 17 being used as a mask, a 0.60 μm-thick waveguide layer ($\lambda_g$=1.15 μm) 18' formed of undoped InGaAsP, a 0.50 μm-thick first upper cladding layer 19'a formed of p-doped InP, a 0.01 μm-thick etch stop layer 25 formed of p-doped InGaAsP, a 1.50 μm-thick second upper cladding layer 19'b formed of p-doped InP, and a 0.20 μm-thick surface layer 20' formed of p-doped InGaAs were successively laminated on the exposed surface 11a of the substrate 11 with the MOCVD method as shown in FIG. 7 to produce a laminated body with a total thickness of 2.81 μm.

Then, the $SiO_2$ film 17 was removed, and a pattern of $SiO_2$ film 17' was formed on the surface layer 16 and the surface layer 20' as shown in FIG. 14 such that the path width of the light amplifier section $A_1$ ($A_2$) was 2.0 μm, and that of the directional coupler section and other waveguide was 8.0 μm. Thereafter, the entire surface was etched with an etchant including sulfuric acid to remove the exposed surface layer. Subsequently, etching was performed using an etchant including hydrochloric acid in place of an etchant including sulfuric acid so that a part of the upper cladding layer 15 was removed at the light amplifier section $A_1$ ($A_2$) and the second upper cladding layer 19'b was removed at the waveguides and the directional coupler section. As a result, a planar pattern was formed such that respective sectional constructions were as shown in FIGS. 10 and 11.

Thus, the light amplifier section $A_1$ ($A_2$) with a path width of 2.0 μm and the waveguides with a path width of 8.0 μm were formed. The ridge height ($h_1$) of the light amplifier section $A_1$ ($A_2$) was 2.20 μm, whereas the ridge height ($h_2$) of the waveguide 2, 3, 5, and 6 was 1.70 μm; the ridge height of the light amplifier section being greater than that of the waveguide.

Then, after all the $SiO_2$ film 17' was removed temporarily, a $SiO_2$ film 21 was formed again to cover the entire surface. Thereafter, AuGeNi/Au was deposited on the back surface of the substrate to mount a common lower electrode 22. The insulating film 21 on the light amplifier section $A_1$ ($A_2$) and the switching section S were removed, where Ti/Pt/Au was deposited to mount upper electrodes 23, 23, and 4. Thus, the light amplifier section $A_1$ ($A_2$) and the directional coupler S of a sectional construction as shown in FIGS. 12 and 15, respectively, were formed.

For this light switch, the injected current for amplifying the light passing through the port was 230 mA and 240 mA when the directional coupler S is in a bar state and in a cross state, respectively. The insertion loss in each case was 2.20 dB and 1.80 dB, respectively.

Example 4

A 1×2 optional coupler shown in FIG. 16 was manufactured as described below.

As shown in FIG. 2, a 0.23 μm-thick waveguide layer ($\lambda_g$=1.05 μm) 12 formed of n-type InGaAsP, a 0.14 μm-thick active layer ($\lambda_g$=1.30 μm) 13 formed of undoped InGaAsP, a 0.23 μm-thick waveguide layer ($\lambda_g$=1.05 μm) 14 formed of p-doped InGaAsP, a 2.00 μm-thick cladding layer 15 formed of p-doped InP, and a 0.20 μm-thick surface layer 16 formed of p-doped InGaAs were successively laminated on the entire surface of a substrate 11 formed of n-type InP by the MOCVD method to produce a laminated body with a total thickness of 2.80 μm.

Then, a SiO$_2$ film 17 was formed on the surface layer 16. With this film being used as a mask, the entire portion of the laminated body excluding the area a$_1$ (a$_2$) of 500 μm in length and 50 μm in width was etched and removed to expose the surface 11a of the surface 11 (FIG. 3).

Again with the SiO$_2$ film 17 being used as a mask, a 0.60 μm-thick waveguide layer (λ$_g$=1.15 μm) 18' formed of undoped InGaAsP, a 0.50 μm-thick first upper cladding layer 19'a formed of undoped InP, a 0.01 μm-thick etch stop layer 25 formed of undoped InGaAsP, and a 1.70 μm-thick second upper cladding layer 19'b formed of undoped InP were successively laminated on the exposed surface 11a of the substrate 11 with the MOCVD method as shown in FIG. 7 to produce a laminated body with a total thickness of 2.81 μm.

Then, the SiO$_2$ film 17 was removed, and a pattern of SiO$_2$ film 17' was formed on the surface layer 16 and the second upper cladding layer 19'b as shown in FIG. 16 such that the path width of the light amplifier section A$_1$ (A$_2$) was 2.0 μm, and that of the waveguide was 8.0 μm. Thereafter, the entire surface was etched with an etchant including sulfuric acid to remove the exposed surface layer at the light amplifier section A$_1$ (A$_2$) and the waveguides. Subsequently, etching was performed using an etchant including hydrochloric acid in place of an etchant including sulfuric acid so that a part of the upper cladding layer 15 was removed at the light amplifier section A$_1$ (A$_2$) and the second upper cladding layer 19'b was removed at the waveguides. As a result, a planar pattern was formed such that respective sectional constructions were as shown in FIGS. 10 and 11.

Thus, the light amplifier section A$_1$ (A$_2$) with a path width of 2.0 μm and the waveguides with a path width of 8.0 μm were formed. The ridge height (h$_1$) of the light amplifier section A$_1$ (A$_2$) was 2.20 μm, whereas the ridge height (h$_2$) of the waveguide was 1.70 μm; the ridge height of the light amplifier section is greater than that of the waveguide.

Then, after all the SiO$_2$ film 17' was removed temporarily, a SiO$_2$ film 21 was formed again to cover the entire surface. Thereafter, AuGeNi/Au was deposited on the back surface of the substrate to mount a common lower electrode 22. The insulating film 21 on the light amplifier section A$_1$ (A$_2$) was removed, where Ti/Pt/Au was deposited to mount upper electrodes 23, 23, respectively. Thus, the light amplifier section A$_1$ (A$_2$) and the waveguides were formed as shown in FIGS. 12 and 17.

For this 1×2 optical coupler, when the injected current to the light amplifier section A$_1$ (A$_2$) was set at 240 mA, a branching ratio of 15 dB was obtained.

AVAILABILITY IN INDUSTRY

For a semiconductor optical component manufactured by the method of the present invention, an insertion loss at the light amplifier section can be reduced to 0 dB, and the extinction ratio can be enhanced when the component operates as a switch.

These are the effects obtained by the fact that the ridge-shaped light amplifier section on the substrate is formed so that its path width is narrower than that of the ridge-shaped waveguide. Since the path width of the light amplifier section is narrower than that of the waveguide, the confining state of the injected current is enhanced sufficiently, so that the current density therein is increased. As a result, light can be amplified highly efficiently.

Also, the ridge height of the light amplifier section greater than that of the waveguide can further increases the coupling efficiency of light.

We claim:

1. A semiconductor optical component comprising:

elevated stepped semiconductor light amplifier sections formed on a substrate, each said semiconductor light amplifier section having a path width, and elevated stepped semiconductor waveguides connected thereto to said semiconductor light amplifier sections and formed on said substrate, each said semiconductor waveguide having a path width, wherein the path width of each said elevated stepped semiconductor light amplifier section is narrower than the path width of each respective said elevated stepped semiconductor waveguide.

2. A semiconductor optical component according to claim 1 wherein each said elevated stepped semiconductor light amplifier section has a stepped height and each said elevated stepped semiconductor waveguide has a stepped height, and the stepped height of each said ridge-shaped semiconductor light amplifier section is greater than the stepped height of each respective said ridge-shaped semiconductor waveguide.

3. A semiconductor optical component according to claim 1 wherein said semiconductor optical component is a total reflection light switch.

4. A semiconductor optical component according to claim 1 wherein said semiconductor optical component is a directional coupler light switch.

5. A semiconductor optical component according to claim 1 wherein said semiconductor optical component is a one input/two output optical coupler.

6. A manufacturing method for a semiconductor optical component in which elevated stepped semiconductor light amplifier sections and elevated stepped semiconductor waveguides connected thereto are integrated on the same substrate, each of said semiconductor light amplifier sections and said semiconductor waveguides having a path width, comprising the steps of:

forming said elevated stepped semiconductor light amplifier sections with said path width thereof narrower than the path width of said elevated stepped semiconductor waveguides at appropriate positions on said substrate; and forming said elevated stepped semiconductor waveguides at positions on said substrate other than said appropriate positions with said semiconductor waveguides being connected to said semiconductor light amplifier sections.

7. A manufacturing method for a semiconductor optical component according to claim 6 wherein each said elevated stepped semiconductor light amplifier section has a stepped height and each said elevated stepped semiconductor waveguide has a stepped height, and further comprising the step of forming each said elevated stepped semiconductor light amplifier section in such a manner that the stepped height thereof is greater than the stepped height of said elevated stepped semiconductor waveguide.

* * * * *